United States Patent
Tanaka

(10) Patent No.: US 9,059,681 B2
(45) Date of Patent: Jun. 16, 2015

(54) UNBALANCED-BALANCED CONVERSION CIRCUIT ELEMENT

(75) Inventor: Akira Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 444 days.

(21) Appl. No.: 13/557,246

(22) Filed: Jul. 25, 2012

(65) Prior Publication Data

US 2013/0033336 A1 Feb. 7, 2013

(30) Foreign Application Priority Data

Aug. 1, 2011 (JP) ................................. 2011-167925

(51) Int. Cl.
*H03H 7/42* (2006.01)
*H03H 7/38* (2006.01)
*H03H 1/00* (2006.01)

(52) U.S. Cl.
CPC ......... *H03H 7/42* (2013.01); *H03H 2001/0085* (2013.01)

(58) Field of Classification Search
CPC .................................. H03H 5/00; H03H 7/42
USPC .............................. 333/25, 26, 177
See application file for complete search history.

(56) References Cited

U.S. PATENT DOCUMENTS

| | | | |
|---|---|---|---|
| 5,886,591 A | | 3/1999 | Jean et al. |
| 6,018,277 A * | | 1/2000 | Vaisanen ........................ 333/26 |
| 6,952,142 B2 * | | 10/2005 | Guitton et al. .................. 333/25 |
| 7,978,021 B2 * | | 7/2011 | Tamaru .......................... 333/25 |
| 2005/0116787 A1 | | 6/2005 | Ohi et al. |
| 2005/0168300 A1 | | 8/2005 | Inoue et al. |
| 2007/0268092 A1 | | 11/2007 | Inoue et al. |
| 2009/0079512 A1 | | 3/2009 | Fujiwara et al. |
| 2009/0315636 A1 | | 12/2009 | Tamaru |
| 2010/0194494 A1 | | 8/2010 | Inoue et al. |
| 2011/0169586 A1 | | 7/2011 | Taniguchi |
| 2013/0307643 A1 * | | 11/2013 | Tanaka et al. ................. 333/177 |

FOREIGN PATENT DOCUMENTS

| | | |
|---|---|---|
| CN | 1625045 A | 6/2005 |
| CN | 101079609 A | 11/2007 |
| CN | 102132490 A | 7/2011 |
| JP | 10-032451 A | 2/1998 |
| JP | 2005-166702 A | 6/2005 |
| JP | 2006-340397 A | 12/2006 |
| JP | 2010-004395 A | 1/2010 |
| JP | 2010-178186 A | 8/2010 |

OTHER PUBLICATIONS

Official Communication issued in corresponding Chinese Patent Application No. 201210270442.9, mailed on Sep. 29, 2014.

* cited by examiner

*Primary Examiner* — Dean Takaoka
(74) *Attorney, Agent, or Firm* — Keating & Bennett, LLP

(57) ABSTRACT

An unbalanced-balanced conversion circuit element includes an inductor connected in series between an unbalanced terminal and a first balanced terminal. The first balanced terminal side of the inductor is grounded via a capacitor. A capacitor is connected in series between the unbalanced terminal and a second balanced terminal. An inductor is connected between the first balanced terminal side of the inductor and the second balanced terminal side of the capacitor. In a laminate defining the unbalanced-balanced conversion circuit element, the capacitor is spaced far from a mounting surface of the laminate in comparison with other circuit elements.

5 Claims, 19 Drawing Sheets

SMITH CHART

PASS CHARACTERISTIC

AMPLITUDE DEVIATION

PHASE DIFFERENCE

FIG. 9

| COMPLEX IMPEDANCE | 50±j0 | 50−j30 | 50−j50 | 50−j80 | 50−j120 |
|---|---|---|---|---|---|
| LH1 [nH] | 10.10 | 9.40 | 7.80 | 6.50 | 6.00 |

FIG. 12

| COMPLEX IMPEDANCE | 50±j0 | 50+j20 | 50+j50 | 50+j80 | 50+j120 |
|---|---|---|---|---|---|
| CL1A [pF] | 0.41 | 0.50 | 0.66 | 0.81 | 0.90 |

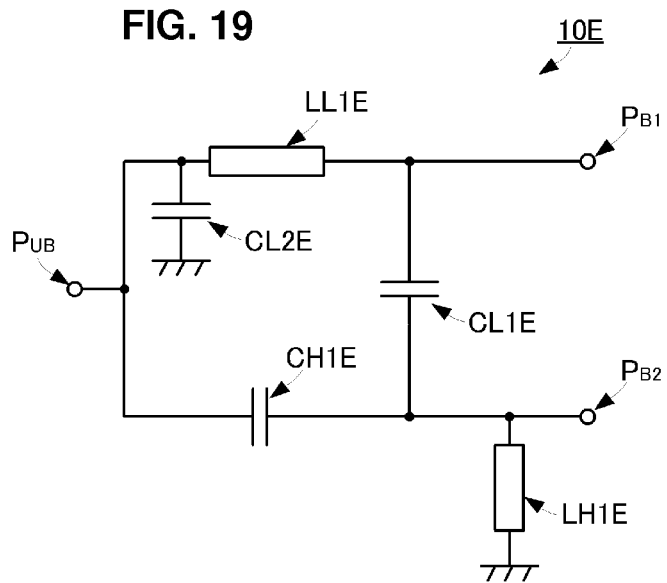

UNBALANCED-BALANCED CONVERSION CIRCUIT ELEMENT

BACKGROUND OF THE INVENTION

1. Field of the Invention

The present invention relates to unbalanced-balanced conversion circuits including lumped parameter circuits on laminated substrates.

2. Description of the Related Art

In many known RF front-end modules, a signal received by an antenna is an unbalanced signal, whereas in RF semiconductor ICs, signal processing is carried out using a balanced signal. Therefore, a circuit having an unbalanced-balanced conversion function to convert an unbalanced signal received by an antenna to a balanced signal is needed. The following two types of circuits are being provided as such an unbalanced-balanced conversion circuit. One is a Marchand type making use of the coupling between transmission lines; the other is a lumped parameter type using a lumped parameter low-pass filter (hereinafter, referred to as LPF) and a lumped parameter high-pass filter (hereinafter, referred to as HPF), which is also described in Japanese Unexamined Patent Application Publication No. 2005-166702.

In the case of a Marchand type, in order to obtain two output signals having a phase difference, a sub transmission line whose length is a quarter of the wavelength of a transmission signal (received signal) is formed with respect to the main transmission line, and the signals are output from both ends of the sub transmission line. This makes it difficult for the Marchand type to be smaller in size than the lumped parameter type.

Accordingly, the lumped parameter type is superior to the Marchand type in realizing a small-sized unbalanced-balanced conversion circuit element. FIG. 1 is a circuit diagram illustrating a general lumped parameter unbalanced-balanced conversion circuit element of the conventional art.

An unbalanced-balanced conversion circuit element of the conventional art includes an unbalanced terminal and a pair of balanced terminals formed of a first balanced terminal and a second balanced terminal.

An inductor is connected in series between the unbalanced terminal and the first balanced terminal. The first balanced terminal side of the inductor is grounded via a capacitor. The series-connected inductor and the shunt-connected capacitor configure an LPF.

A capacitor is connected in series between the unbalanced terminal and the second balanced terminal. The second balanced terminal side of the capacitor is grounded via an inductor. The series-connected capacitor and the shunt-connected inductor configure an HPF.

However, it is difficult for the unbalanced-balanced conversion circuit element of the conventional art as shown in FIG. 1, when connected with an RF semiconductor IC, to perform matching on phase components of the impedance. Therefore, a front-end module of the conventional art needs to have a circuit configuration as shown in FIG. 2. FIG. 2 is a circuit configuration diagram of an RF front-end module of the conventional art. As shown in FIG. 2, the RF front-end module of the conventional art includes the aforementioned unbalanced-balanced conversion circuit element, an antenna, a matching circuit, and an RF semiconductor IC. The antenna is connected to the unbalanced terminal of the unbalanced-balanced conversion circuit element. The RF semiconductor IC is connected to the balanced terminals formed of the first balanced terminal and the second balanced terminal of the unbalanced-balanced conversion circuit element via the matching circuit.

The matching circuit includes an inductor connected in series and a capacitor shunt-connected to the first balanced terminal, and an inductor connected in series and a capacitor shunt-connected to the second balanced terminal.

Therefore, although the unbalanced-balanced conversion circuit element is of a lumped parameter type and can be small in size, the matching circuit is additionally required, which prevents the reduction in size as an RF front-end module. Further, although the matching between the unbalanced-balanced conversion circuit element and the RF semiconductor IC can be successfully carried out, insertion loss as the RF front-end module is deteriorated due to the matching circuit being additionally required.

SUMMARY OF THE INVENTION

Accordingly, preferred embodiments of the present invention provide an unbalanced-balanced conversion circuit that does not need a matching circuit even in the case where it is connected to an element which needs to adjust the phase component of input impedance at the time of matching, can be easily made smaller in size, and can transmit a signal with low loss.

According to a preferred embodiment of the present invention, an unbalanced-balanced conversion circuit element includes an unbalanced terminal that inputs/outputs an unbalanced signal, and a pair of balanced terminals including a first balanced terminal and a second balanced terminal that input/output a balanced signal; wherein the unbalanced-balanced conversion circuit element includes a first inductor, a first capacitor, and an impedance adjustment element. The first inductor is connected in series between the unbalanced terminal and the first balanced terminal. The first capacitor is connected in series between the unbalanced terminal and the second balanced terminal. The impedance adjustment element preferably is defined by an inductor or a capacitor that is connected between the first balanced terminal side of the first inductor and the second balanced terminal side of the first capacitor.

In this configuration, by providing the impedance adjustment element that is connected to both a circuit of the first balanced terminal side including the first inductor and a circuit of the second balanced terminal side including the first capacitor, it is possible to rotate the circuit of the first balanced terminal side and the circuit of the second balanced terminal side by the same phase rotation at the same time. This makes it possible to adjust the phase component of output impedance of the balanced terminals including the first balanced terminal and the second balanced terminal with an element value of the impedance adjustment element. In this case, a sufficient phase rotation can be obtained and an obtainable phase range can be widened only by using a single inductor or capacitor as the impedance adjustment element, i.e., no need to use many circuit elements.

An unbalanced-balanced conversion circuit element according to a preferred embodiment of the present invention may preferably have a configuration as described below. The unbalanced-balanced conversion circuit element includes a laminate in which a plurality of dielectric layers are laminated. A first inductor, a first capacitor, and an impedance adjustment element are preferably defined by electrode patterns that are provided on the plurality of dielectric layers of the laminate. The first inductor and the impedance adjustment element are disposed between the first capacitor and a mounting surface of the laminate. In other words, the first capacitor is disposed on the opposite side of the mounting surface of the laminate with a formation region of the first inductor and the impedance adjustment element being disposed therebetween along a laminating direction.

In this configuration, since the first capacitor that is not grounded is located far from the mounting surface, a distance between a ground electrode that is located on the mounting surface or on a layer near the mounting surface and opposite electrodes defining the first capacitor can be made longer in the laminate. This makes it possible to significantly reduce and prevent parasitic capacitance from being generated between the ground electrode and the first capacitor and improve the insertion loss.

Further, according to a preferred embodiment of the present invention, an unbalanced-balanced conversion circuit element may preferably have a configuration as described below. This unbalanced-balanced conversion circuit element includes a direct-current (DC) component eliminating capacitor that is connected in series between a connection point of a first inductor and a first capacitor and an unbalanced terminal. The DC component eliminating capacitor preferably includes electrode patterns disposed on a plurality of dielectric layers. The first inductor and an impedance adjustment element are disposed between the DC component eliminating capacitor and a mounting surface of the laminate. In other words, along the laminating direction, the DC component eliminating capacitor is disposed on the opposite side of the mounting surface of the laminate with a formation region of the first inductor and the impedance adjustment element being disposed therebetween.

With this configuration, it is also possible to significantly reduce and prevent the generation of parasitic capacitance in the DC component eliminating capacitor that is connected in series to the unbalanced terminal and is not directly grounded, so to make it possible to improve insertion loss even in a configuration that includes a DC component eliminating capacitor.

Further, according to a preferred embodiment of the present invention, an unbalanced-balanced conversion circuit element may preferably include a DC voltage application terminal to apply a DC voltage, and the DC voltage application terminal may be preferably connected to a first inductor and a first capacitor.

With this configuration, a DC component can be supplied to a pair of balanced terminals including a first balanced terminal and a second balanced terminal. That is to say, a DC voltage can be supplied to an RF semiconductor IC disposed at a subsequent stage.

Furthermore, according to a preferred embodiment of the present invention, an unbalanced-balanced conversion circuit element may preferably have a configuration as described below. This unbalanced-balanced conversion circuit element includes a filter-characteristic adjustment element that connects a first balanced terminal or a second balanced terminal to the ground. In this case, if an impedance adjustment element is defined by an inductor, the filter-characteristic adjustment element is defined by a capacitor that connects the first balanced terminal to the ground. If the impedance adjustment element is defined by a capacitor, the filter-characteristic adjustment element is defined by an inductor that connects the second balanced terminal to the ground.

With this configuration in which the filter-characteristic adjustment element is included, it is possible to appropriately adjust not only impedance but also filter characteristics of the unbalanced-balanced conversion circuit element with an easy and simple configuration.

In addition, according to a preferred embodiment of the present invention, an unbalanced-balanced conversion circuit element may preferably include a second capacitor that connects an end portion of a first inductor on the side of a connection point between the first inductor and a first capacitor to the ground.

In this configuration, since the second capacitor is connected between an unbalanced terminal and the ground, the center frequency can be lowered. That is, the frequency of a signal to be transmitted can be shifted to a lower-frequency side while maintaining impedance characteristics, balance characteristics and so on.

According to a preferred embodiment of the present invention, it is possible to provide an unbalanced-balanced conversion circuit having a small size and that is capable of transmitting RF signals with low loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a chart illustrating a relationship between output impedance values and element values of an inductor (inductance).

FIG. 12 is a chart illustrating a relationship between output impedance values and element values of a capacitor (capacitance).

FIG. 19 is a circuit diagram of an unbalanced-balanced conversion circuit element according to a sixth preferred embodiment of the present invention.

DETAILED DESCRIPTION OF THE PREFERRED EMBODIMENTS

Figure 3:
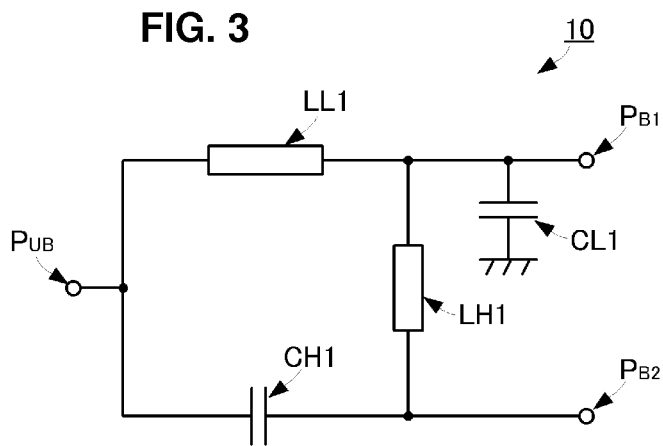
FIG. 3 is a circuit diagram of an unbalanced-balanced conversion circuit element according to a first preferred embodiment of the present invention.

Hereinbelow, an unbalanced-balanced conversion circuit element according a first preferred embodiment of the present invention will be described with reference to FIGS. 3-9. FIG. 3 is a circuit diagram of an unbalanced-balanced conversion circuit element 10 according to the first preferred embodiment.

The unbalanced-balanced conversion circuit element 10 includes an unbalanced terminal $P_{UB}$ and balanced terminals including a first balanced terminal $P_{B1}$ and a second balanced terminal $P_{B2}$.

An inductor LL1 is connected in series between the unbalanced terminal $P_{UB}$ and the first balanced terminal $P_{B1}$. This inductor LL1 corresponds to the first inductor according to an aspect of a preferred embodiment of the present invention. The first balanced terminal $P_{B1}$ side of the inductor LL1 is grounded via a capacitor CL1. This capacitor CL1 corresponds to the filter-characteristic adjustment element according to an aspect of a preferred embodiment of the present invention. The inductor LL1 and the capacitor CL1 define a low-pass filter (LPF).

A capacitor CH1 is connected in series between the unbalanced terminal $P_{UB}$ and the second balanced terminal $P_{B2}$. This capacitor CH1 corresponds to the first capacitor according to an aspect of a preferred embodiment of the present invention. A high-pass filter (HPF) is preferably defined mainly by the capacitor CH1.

A signal having been input from the unbalanced terminal $P_{UB}$ and having passed through the inductor LL1 is output from the first balanced terminal $P_{B1}$; note that the phase of the signal is advanced by the inductor LL1. Simultaneously, a signal having been input from the unbalanced terminal $P_{UB}$ and having passed through the capacitor CH1 is output from the second balanced terminal $P_{B2}$; note that the phase of the signal is delayed by the capacitor CH1. This causes a phase difference of 180 degrees between the phases of the signal output from the first balanced terminal $P_{B1}$ and the signal output from the second balanced terminal $P_{B2}$. Accordingly, an unbalanced signal that is input from the unbalanced terminal PUB is output as a balanced signal from the balanced terminals including the first balanced terminal $P_{B1}$ and the second balanced terminal $P_{B2}$, in which the unbalanced-balanced conversion circuit element 10 defines an unbalanced-balanced conversion circuit.

An inductor LH1 is connected between the first balanced terminal $P_{B1}$ side of the inductor LL1 and the second balanced terminal $P_{B2}$ side of the capacitor CH1. This inductor LH1 corresponds to the impedance adjustment element according to an aspect of a preferred embodiment of the present invention.

Figure 4:
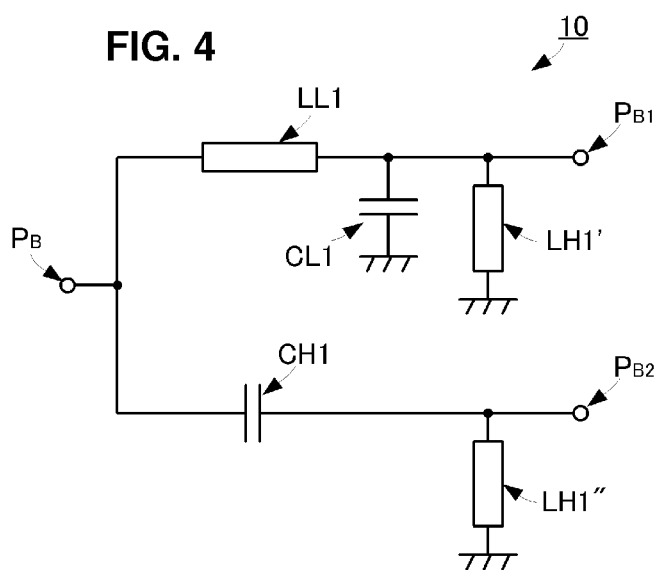
FIG. 4 is an equivalent circuit diagram of the unbalanced-balanced conversion circuit element according to the first preferred embodiment of the present invention.

In the unbalanced-balanced conversion circuit element 10 having such a circuit configuration, since the inductor LH1 shown in FIG. 3 can be considered to be virtually grounded, the unbalanced-balanced conversion circuit element 10 can be expressed in an equivalent circuit as shown in FIG. 4. FIG. 4 is an equivalent circuit diagram of the unbalanced-balanced conversion circuit element 10 according to the first preferred embodiment.

The inductor LH1 connected between the first balanced terminal $P_{B1}$ side of the inductor LL1 and the second balanced terminal $P_{B2}$ side of the capacitor CH1 is equivalent to the following two inductors connected in series via the ground in the equivalent circuit as shown in FIG. 4: an inductor LH1' that connects the first balanced terminal $P_{B1}$ side of the inductor LL1 to the ground; and an inductor LH1" that connects the second balanced terminal $P_{B2}$ side of the capacitor CH1 to the ground. Note that the inductor LH1' and the inductor LH1" have the same inductance.

With this configuration, it can be considered that the inductors having the same inductance are respectively shunt-connected to a circuit of the first balanced terminal $P_{B1}$ side and a circuit of the second balanced terminal $P_{B2}$ side. This makes it possible to rotate the phase of impedance which is viewed from the first balanced terminal $P_{B1}$ toward the unbalanced terminal $P_{UB}$ side and the phase of impedance which is viewed from the second balanced terminal $P_{B2}$ toward the unbalanced terminal $P_{UB}$ side by the same phase amount. This phase rotation is determined by the inductance of the inductor LL1.

Accordingly, by providing the above-mentioned inductor LH1, the phase component of output impedance of the balanced terminals including the first balanced terminal $P_{B2}$ and the second balanced terminal $P_{B2}$ can be shifted from zero to a negative direction. At this time, the phase component can be appropriately set by setting the inductance of the inductor LH1 as appropriate.

As a result, even if an RF semiconductor IC with input impedance having a negative phase component is connected to the balanced terminal side of the unbalanced-balanced conversion circuit element 10, the phase component of output impedance of the balanced terminals of the unbalanced-balanced conversion circuit element 10 can be set so as to be matched with the phase component of input impedance of the RF semiconductor IC.

Figure 5A:
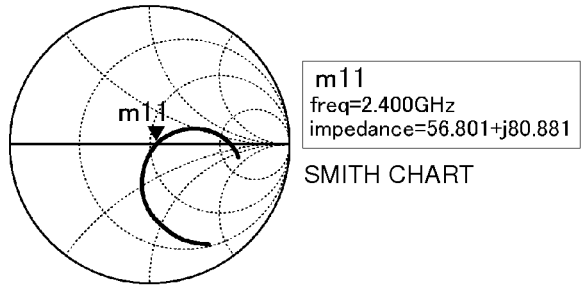
FIGS. 5A through 5D are diagrams illustrating various kinds of characteristics of the unbalanced-balanced conversion circuit element according to the first preferred embodiment of the present invention.
Figure 5B:
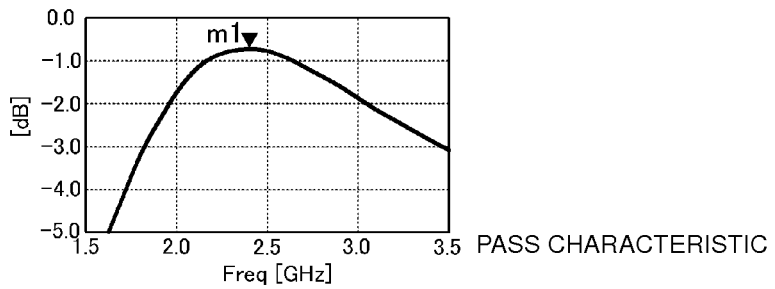
Figure 5C:
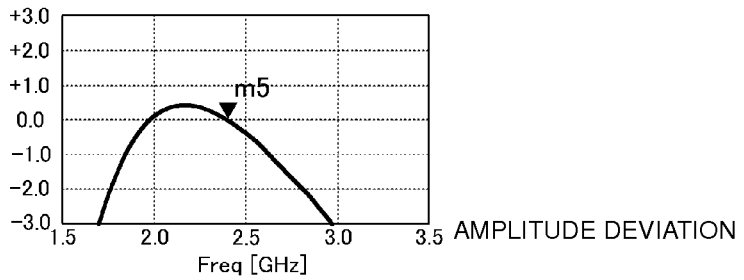
Figure 5D:
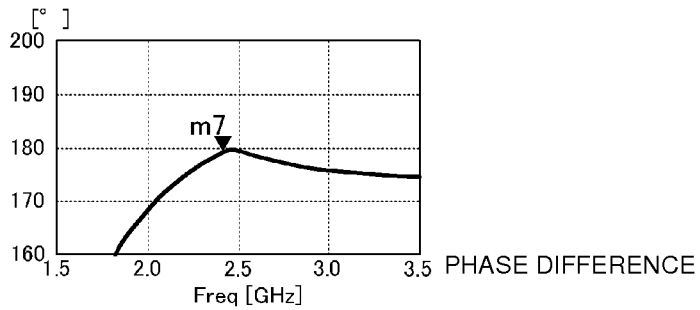

FIGS. 5A through 5D are diagrams illustrating various kinds of characteristics of the unbalanced-balanced conversion circuit element 10 according to the present preferred embodiment. FIG. 5A is a Smith chart illustrating differential mode output impedance of the balanced terminal side. FIG. 5B is a diagram illustrating a pass characteristic of a balanced output signal in the differential mode. FIG. 5C is a diagram illustrating amplitude deviation of output signals from the two balanced terminals. FIG. 5D is a diagram illustrating phase difference between output signals from the two balanced terminals. Note that the simulation results shown in FIGS. 5A through 5D are obtained through simulations under the conditions as follows. It is assumed that the input impedance of an RF semiconductor IC is about 50−j80Ω in the about 2.4 GHz band as a passband; then, inductance of each inductor and capacitance of each capacitor are set so that the output impedance of the balanced terminal side of the unbalanced-balanced conversion circuit element 10 becomes about 50+j80 Ω.

According to the present preferred embodiment, as indicated by an m11 marking in FIG. 5A, the input impedance preferably is about 50+j80Ω at about 2.4 GHz, for example. Accordingly, it can be considered that desired input impedance is realized with a simple configuration.

Further, as indicated by an m1 marking in FIG. 5B, the attenuation is equal to or less than about 1 dB at 2.4 GHz, for example. Therefore, it is possible to realize a characteristic of lower insertion loss.

Furthermore, as indicated by an m5 marking in FIG. 5C, amplitude difference between signals at the two balanced terminals is about 0 dB at about 2.4 GHz, for example. Therefore, it is possible to realize a characteristic exhibiting nearly no amplitude deviation.

In addition, as indicated by an m7 marking in FIG. 5D, phase difference between signals at the two balanced terminals preferably is about 180 degrees at about 2.4 GHz, for example. To rephrase, an ideal phase difference for the balanced terminals, i.e., 180 degrees, can be realized.

As described thus far, by using the configuration of the present preferred embodiment, it is possible to realize an unbalanced-balanced conversion circuit element having excellent transmission characteristics and excellent balance characteristics with a simple configuration.

Figure 6:
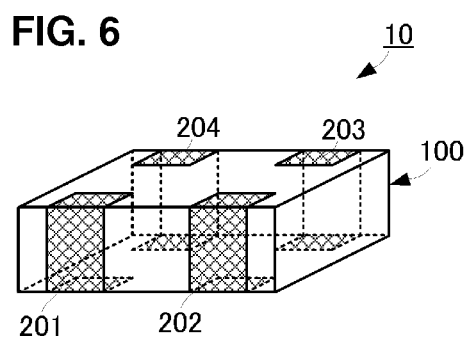
FIG. 6 is an exterior perspective view of the unbalanced-balanced conversion circuit element according to the first preferred embodiment of the present invention.
Figure 7:
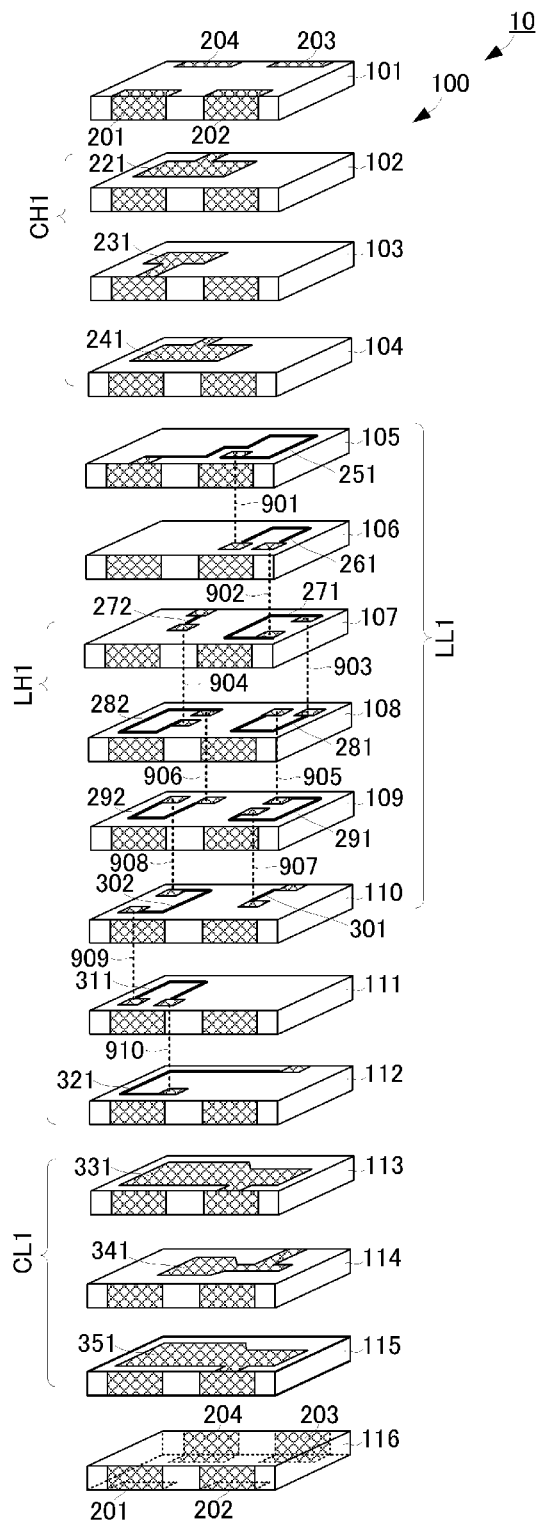
FIG. 7 is an exploded perspective view of the unbalanced-balanced conversion circuit element according to the first preferred embodiment of the present invention.

The unbalanced-balanced conversion circuit element 10 including the above-described circuit configuration preferably is realized by a laminate as described in FIG. 6 and FIG. 7. FIG. 6 is an exterior perspective view of the unbalanced-balanced conversion circuit element 10. FIG. 7 is an exploded perspective view of the unbalanced-balanced conversion circuit element 10.

The unbalanced-balanced conversion circuit element 10 preferably includes a substantially rectangular-shaped laminate 100 as shown in FIG. 6. A first external electrode 201 and a second external electrode 201 are separated from each other by a predetermined length on a first side surface (front surface in FIG. 6) of the laminate 100. A third external electrode 203 and a fourth external electrode 204 are separated from each other by a predetermined length on a second side surface (rear surface in FIG. 6) of the laminate 100 which is opposed to the first side surface. These external electrodes are disposed so that the first external electrode 201 is opposed to the fourth external electrode 204, while the second external electrode 202 is opposed to the third external electrode 203. The first, second, third and fourth external electrodes 201, 202, 203 and 204 are arranged such that the electrode is not only extended on each formation surface (side surface) but also extended up to the top surface (upper surface in FIG. 6) and down to the bottom surface (lower surface in FIG. 6) of the laminate 100. The laminate 100 is mounted, with its bottom surface as a mounting surface, on an external circuit board on which an RF semiconductor IC and the like are mounted.

In the unbalanced-balanced conversion circuit element of the present preferred embodiment, the first external electrode 201 corresponds to the unbalanced terminal $P_{UB}$, the second external electrode 202 corresponds to a ground connecting terminal GND, the third external electrode 203 corresponds to the first balanced terminals $P_{B1}$, and the fourth external electrode 204 corresponds to the second balanced terminal $P_{B2}$.

The laminate 100 is, as shown in FIG. 7, preferably formed by laminating 16 dielectric layers on each of which a predetermined electrode pattern is formed. Hereinafter, the configuration of electrode patterns will be described, in which the uppermost layer as the top surface of the laminate 100 is referred to as a first (1st) layer, and the lowermost layer as the bottom surface of the laminate 100 is referred to as a sixteenth (16th) layer.

The first external electrode 201, the second external electrode 202, the third external electrode 203 and the fourth external electrode 204 are located on a dielectric layer 101 of the 1st layer. The first external electrode 201, the second external electrode 202, the third external electrode 203 and the fourth external electrode 204 are arranged to extend from the side surfaces of the dielectric layer 101 up to the top surface.

The first external electrode 201, the second external electrode 202, the third external electrode 203 and the fourth external electrode 204 are connected with the side surfaces of dielectric layers 102 through 116 in the laminating direction.

Plate electrodes 221, 231 and 241 are located on a dielectric layer 102 of a 2nd layer, a dielectric layer 103 of a 3rd layer and a dielectric layer 104 of a 4th layer, respectively. The plate electrode 231 is opposed to the plate electrode 221 and the plate electrode 241 so as to define the capacitor CH1. The plate electrode 221 and the plate electrode 241 are extracted and connected to the fourth external electrode 204. The plate electrode 231 is extended and connected to the first external electrode 201.

Line electrodes 251, 261, 271, 281, 291 and 301 defining the inductor LL1 are located on a dielectric layer 105 of a 5th layer, a dielectric layer 106 of a 6th layer, a dielectric layer 107 of a 7th layer, a dielectric layer 108 of an 8th layer, a dielectric layer 109 of a 9th layer and a dielectric layer 110 of a 10th layer, respectively. One end of the line electrode 251 is connected to the first external electrode 201. One end of the line electrode 301 is connected to the third external electrode 203.

The line electrode 251 and the line electrode 261 are connected to each other by a via electrode 901 in the laminating direction. The line electrode 261 and the line electrode 271 are connected to each other by a via electrode 902 in the laminating direction. The line electrode 271 and the line electrode 281 are connected to each other by a via electrode 903 in the laminating direction. The line electrode 281 and the line electrode 291 are connected to each other by a via electrode 905 in the laminating direction. The line electrode 291 and the line electrode 301 are connected to each other by a via electrode 907 in the laminating direction.

Line electrodes 272, 282, 292, 302, 311 and 321 defining the inductor LH1 are located on the dielectric layer 107 of the 7th layer, the dielectric layer 108 of the 8th layer, the dielectric layer 109 of the 9th layer, the dielectric layer 110 of the 10th layer, a dielectric layer 111 of an 11th layer and a dielectric layer 112 of a 12th layer, respectively. One end of the line electrode 272 is connected to the fourth external electrode 204. One end of the line electrode 321 is connected to the third external electrode 203.

The line electrode 272 and the line electrode 282 are connected to each other by a via electrode 904 in the laminating direction. The line electrode 282 and the line electrode 292 are connected to each other by a via electrode 906 in the laminating direction. The line electrode 292 and the line electrode 302 are connected to each other by a via electrode 908 in the laminating direction. The line electrode 302 and the line electrode 311 are connected to each other by a via electrode 909 in the laminating direction. The line electrode 311 and the line electrode 321 are connected to each other by a via electrode 910 in the laminating direction.

Plate electrodes 331, 341 and 351 are located on a dielectric layer 113 of a 13th layer, a dielectric layer 114 of a 14th layer and a dielectric layer 115 of a 15th layer, respectively.

The plate electrode 341 is opposed to the plate electrode 331 and the plate electrode 351 so as to define the capacitor CL1. The plate electrodes 331 and 351 are extracted and connected to the second external electrode 202. The plate electrodes 331 and 351 function as an inner layer ground electrode in the laminate 100. The plate electrode 341 is extracted and connected to the third external electrode 203.

The first external electrode 201, the second external electrode 202, the third external electrode 203 and the fourth external electrode 204 are located on the dielectric layer 116 of the 16th layer. The first external electrode 201, the second external electrode 202, the third external electrode 203 and the fourth external electrode 204 extend from the side surfaces of the dielectric layer 116 down to the bottom surface.

With the structure as described above, a circuit element that defines the unbalanced-balanced conversion circuit element 10 is provided, in which the capacitor CH1, the inductors LL1, LH1, and the capacitor CL1 are arranged in this order from the top surface side of the laminate 100. The inner layer ground electrodes of the laminate 100 are, as described above, the plate electrodes 331 and 351 on the dielectric layers 113 and 115 near the bottom surface of the laminate 100. Accordingly, the dielectric layers defining the inductors LL1, LH1 lie between the plate electrodes 221, 231, 241 defining the capacitor CH1 and the plate electrode 341, the plate electrodes 331, 351 defining the inner layer ground electrodes. Thus, the plate electrodes 221, 231 and 241 defining the capacitor CH1 are spaced from the plate electrode 341 and the plate electrodes 331, 351 defining the inner layer ground electrodes, thereby making it possible to significantly reduce and prevent the generation of parasitic capacitance between the plate electrodes 221, 231 and 241 and the plate electrodes 331, 341 and 351.

Figure 8:
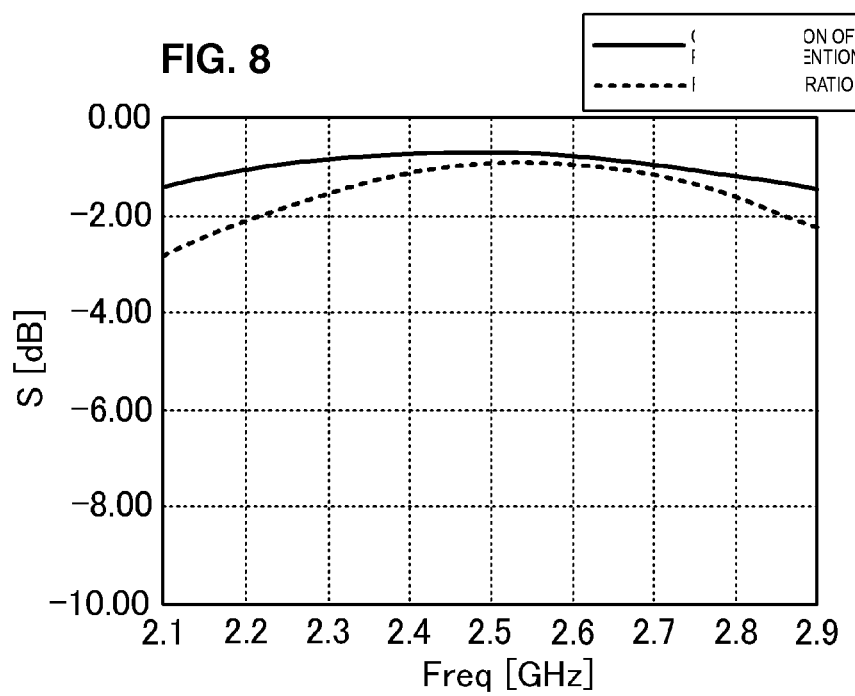
FIG. 8 is a diagram illustrating an insertion loss characteristic of the unbalanced-balanced conversion circuit element in a configuration according to a preferred embodiment of the present invention and an insertion loss characteristic in a case where a capacitor is disposed at the bottom surface side of a laminate (Ref configuration).

FIG. 8 is a diagram illustrating an insertion loss characteristic of the unbalanced-balanced conversion circuit element 10 in the configuration according to a preferred embodiment of the present invention and an insertion loss characteristic in a case where the plate electrodes 221, 231 and 241 defining the capacitor CH1 are not spaced from the plate electrodes 331, 351 defining the inner layer ground electrodes, and these plate electrodes 221, 231, 241, 331 and 351 are disposed together at the bottom surface side of the laminate 100 (Ref configuration). FIG. 8 illustrates the insertion loss at near 2.4 GHz as a passband, where a solid line represents the insertion loss characteristic according to an aspect of a preferred embodiment of the present invention, and a broken line represents the insertion loss characteristic of the Ref configuration. As shown in FIG. 8, with the configuration according to the present preferred of the present invention, the generation of parasitic capacitance is significantly reduced and prevented as described above, thereby making it possible to improve insertion loss.

Although, in the above explanation, only a case in which there is one type of input impedance is described, a wide range of phase components can be realized by appropriately setting the element values of circuit elements defining the unbalanced-balanced conversion circuit element 10. FIG. 9 is a chart illustrating a relationship between output impedance values and element values of the inductor LH1 (inductance). As shown in FIG. 9, by using the configuration of the present preferred embodiment, the complex impedance ranging from equal to or less than about $50 \pm j0\Omega$ down to about $50 - j120\Omega$, for example, can be realized only by changing the element value (inductance) of the inductor LH1. Accordingly, even if the laminate is small in size, a wide range of complex impedances can be realized for the above-mentioned phase components. In other words, the unbalanced-balanced conversion circuit element 10 capable of realizing a wide range of complex impedances for phase components can have a small size.

Figure 10:
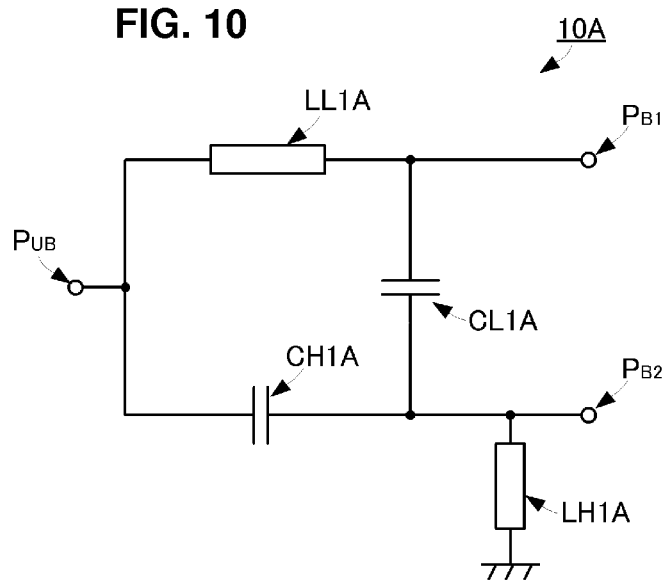
FIG. 10 is a circuit diagram of an unbalanced-balanced conversion circuit element according to a second preferred embodiment of the present invention.

Next, an unbalanced-balanced conversion circuit element according to a second preferred embodiment of the present invention will be described with reference to the drawings. FIG. 10 is a circuit diagram of an unbalanced-balanced conversion circuit element 10A according to the second preferred embodiment.

The unbalanced-balanced conversion circuit element 10A includes the unbalanced terminal $P_{UB}$ and the balanced terminals including the first balanced terminal $P_{B2}$ and the second balanced terminal $P_{B2}$.

An inductor LL1A is connected in series between the unbalanced terminal $P_{UB}$ and the first balanced terminal $P_{B2}$. This inductor LL1A corresponds to the first inductor according to an aspect of a preferred embodiment of the present invention. A low-pass filter (LPF) is preferably defined mainly by the inductor LL1A.

A capacitor CH1A is connected in series between the unbalanced terminal $P_{UB}$ and the second balanced terminal $P_{B2}$. This capacitor CH1A corresponds to the first capacitor according to an aspect of a preferred embodiment of the present invention. The second balanced terminal $P_{B2}$ side of the capacitor CH1A is grounded via an inductor LH1A. This inductor LH1A corresponds to the filter-characteristic adjustment element according to an aspect of a preferred embodiment of the present invention. The capacitor CH1A and the inductor LH1A define a high-pass filter (HPF).

A capacitor CL1A is connected between the first balanced terminal $P_{B1}$ side of the inductor LL1A and the second balanced terminal $P_{B2}$ side of the capacitor CH1A. This capacitor CL1A corresponds to the impedance adjustment element according to an aspect of a preferred embodiment of the present invention.

In the unbalanced-balanced conversion circuit element 10A having such a circuit configuration, since the capacitor CL1A can be considered to be virtually grounded, the unbalanced-balanced conversion circuit element 10A can be expressed in an imaged equivalent circuit in which the capacitor CL1A connected between the first balanced terminal $P_{B1}$ side of the inductor LL1A and the second balanced terminal $P_{B2}$ side of the capacitor CH1A is equivalent to the following two capacitors connected in series via the ground: a capacitor CL1A' that connects the first balanced terminal $P_{B1}$ side of the inductor LL1A to the ground; and a capacitor CL1A" that connects the second balanced terminal $P_{B2}$ side of the capacitor CH1A to the ground. Note that the capacitor CL1A' and the capacitor CL1A" have the same capacitance.

With this configuration, it can be considered that the capacitors having the same capacitance are respectively shunt-connected to a circuit of the first balanced terminal $P_{B1}$ side and a circuit of the second balanced terminal $P_{B2}$ side. This makes it possible to rotate the phase of impedance which is viewed from the first balanced terminal $P_{B1}$ toward the unbalanced terminal $P_{UB}$ side and the phase of impedance which is viewed from the second balanced terminal $P_{B2}$ toward the unbalanced terminal $P_{UB}$ side by the same phase amount. This phase rotation is determined by the capacitance of the capacitor CL1A. Note that the direction of phase rotation in this configuration is reversed with respect to the direction in the configuration of the first preferred embodiment.

Accordingly, by providing the above-mentioned capacitor CL1A, the phase component of output impedance of the balanced terminals including the first balanced terminal $P_{B2}$ and the second balanced terminal $P_{B2}$ can be shifted from zero to a positive direction. At this time, the phase component can be appropriately set by setting the capacitance of the capacitor CL1A as appropriate.

Through this, even if an RF semiconductor IC with input impedance having a positive phase component is connected to the balanced terminal side of the unbalanced-balanced conversion circuit element 10A, the phase component of output impedance of the balanced terminals of the unbalanced-balanced conversion circuit element 10A can be set so as to be matched with the phase component of input impedance of the RF semiconductor IC.

Figure 11:
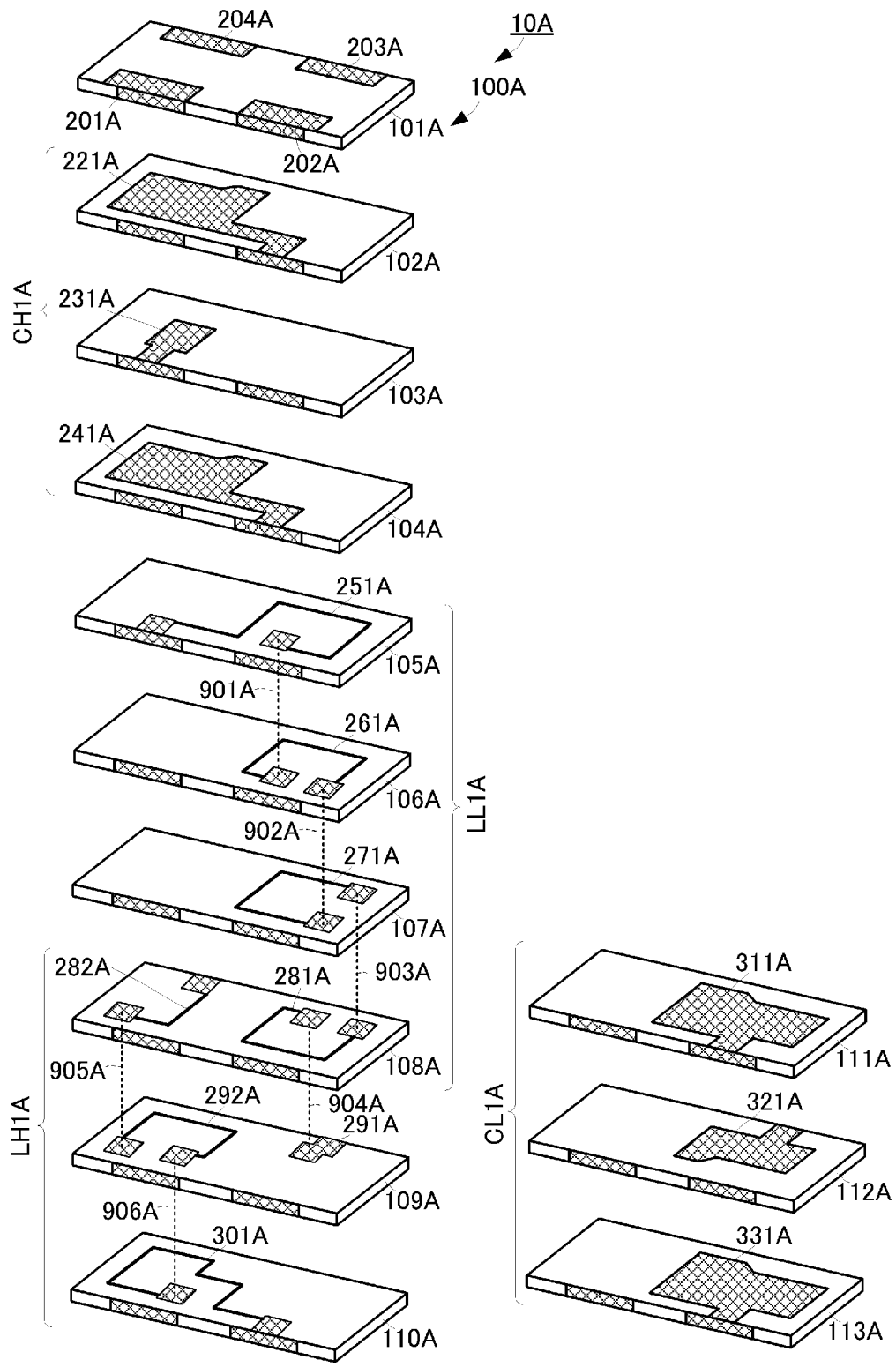
FIG. 11 is an exploded perspective view of the unbalanced-balanced conversion circuit element.

The unbalanced-balanced conversion circuit element 10A having the above-described circuit configuration is preferably realized by a laminate 100A as described in FIG. 11. FIG. 11 is an exploded perspective view of the unbalanced-balanced conversion circuit element 10A. Because the outer shape of the unbalanced-balanced conversion circuit element 10A has the same constituent elements as the outer shape of the unbalanced-balanced conversion circuit element 10 described in the first preferred embodiment, detailed description thereof is omitted. Note that, in the unbalanced-balanced conversion circuit element 10A of the present preferred embodiment, a first external electrode 201A corresponds to the unbalanced terminal $P_{UB}$ and a second external electrode 202A corresponds to the second balanced terminal $P_{B2}$. Further, in the unbalanced-balanced conversion circuit element 10A of the present preferred embodiment, a third external electrode 203A corresponds to the first balanced electrode $P_{B1}$ and a fourth external electrode 204A corresponds to the ground connecting terminal GND.

The laminate 100A is, as shown in FIG. 11, preferably formed by laminating 13 dielectric layers on each of which a predetermined electrode pattern is formed. Hereinafter, the configuration of electrode patterns will be described, in which the uppermost layer as the top surface of the laminate 100A is referred to as a 1st layer, and the lowermost layer as the bottom surface of the laminate 100A is referred to as a 13th layer.

The first external electrode 201A, the second external electrode 202A, the third external electrode 203A and the fourth external electrode 204A are located on a dielectric layer 101A of the 1st layer. The first external electrode 201A, the second external electrode 202A, the third external electrode 203A and the fourth external electrode 204A are located extending from the side surfaces of the dielectric layer 101A up to the top surface.

The first external electrode 201A, the second external electrode 202A, the third external electrode 203A and the fourth external electrode 204A are connected with the side surfaces of dielectric layers 102A through 113A in the laminating direction.

Plate electrodes 221A, 231A and 241A are located on a dielectric layer 102A of a 2nd layer, a dielectric layer 103A of a 3rd layer and a dielectric layer 104A of a 4th layer, respectively. The plate electrode 231A is opposed to the plate electrode 221A and the plate electrode 241A so as to define the capacitor CH1A. The plate electrodes 221A and 241A are extracted and connected to the second external electrode 202A. The plate electrode 231A is extended and connected to the first external electrode 201A.

Line electrodes 251A, 261A, 271A and 281A defining the inductor LL1A are located on a dielectric layer 105A of a 5th layer, a dielectric layer 106A of a 6th layer, a dielectric layer 107A of a 7th layer and a dielectric layer 108A of an 8th layer, respectively. One end of the line electrode 251A is connected to the first external electrode 201A. The line electrode 281A is extracted and connected to the third external electrode 203A through a via electrode 904A and a plate electrode 291A on a dielectric layer 109A.

The line electrode 251A and the line electrode 261A are connected to each other by a via electrode 901A in the laminating direction. The line electrode 261A and the line electrode 271A are connected to each other by a via electrode 902A in the laminating direction. The line electrode 271A and the line electrode 281A are connected to each other by a via electrode 903A in the laminating direction.

Line electrodes 282A, 292A and 301A defining the inductor LH1A are located on the dielectric layer 108A of the 8th layer, a dielectric layer 109A of a 9th layer and a dielectric layer 110A of a 10th layer, respectively. One end of the line electrode 282A is connected to the fourth external electrode 204A. One end of the line electrode 301A is connected to the second external electrode 202A.

The line electrode 282A and the line electrode 292A are connected to each other by a via electrode 905A in the laminating direction. The line electrode 292A and the line electrode 301A are connected to each other by a via electrode 906A in the laminating direction.

Plate electrodes 311A, 321A and 331A are located on a dielectric layer 111A of an 11th layer, a dielectric layer 112A of a 12th layer and a dielectric layer 113A of a 13th layer, respectively. The plate electrode 321A is opposed to the plate electrodes 311A and 331A so as to define the capacitor CL1A. The plate electrodes 311A and 331A are extracted and connected to the second external electrode 202A. The plate electrodes 311A and 331A define an inner layer ground electrode in the laminate 100A. The plate electrode 321A is extracted and connected to the third external electrode 203A.

The first external electrode 201A, the second external electrode 202A, the third external electrode 203A and the fourth external electrode 204A are located on the dielectric layer 113A of the 13th layer. The first external electrode 201A, the second external electrode 202A, the third external electrode 203A and the fourth external electrode 204A extend from the side surfaces of the dielectric layer 113A down to the bottom surface.

With the structure as described above, a circuit element that defines the unbalanced-balanced conversion circuit element 10A is provided, in which the capacitor CH1A, the inductors LL1A, LH1A, and the capacitor CL1A are provided in this order from the top surface side of the laminate 100A. The inner layer ground electrodes of the laminate 100A are, as described above, the plate electrodes 311A and 331A on the dielectric layers 111A and 113A near the bottom surface of the laminate 100A. Accordingly, the dielectric layers defining the inductors LL1A, LH1A lie between the plate electrodes 221A, 231A, 241A defining the capacitor CH1A and the plate electrode 321A, the plate electrodes 311A, 331A defining the inner surface ground electrodes. Thus, the plate electrodes 221A, 231a and 241A defining the capacitor CH1A are spaced from the plate electrode 321A and the plate electrodes 311A, 331A defining the inner layer ground electrodes, thereby making it possible to significantly reduce and prevent the generation of parasitic capacitance between the plate electrodes 221A, 231A and 241A and the plate electrodes 311A, 321A and 331A.

A wide range of phase components can be realized by appropriately setting the element values of circuit elements defining the unbalanced-balanced conversion circuit element 10A of the present preferred embodiment, as in the unbalanced-balanced conversion circuit element 10 of the first preferred embodiment. FIG. 12 is a chart illustrating a relationship between output impedance values and element values of the capacitor CL1A (capacitance). As shown in FIG.

12, with the configuration of the present preferred embodiment, the complex impedances ranging from equal to or greater than about 50±j0Ω up to about 50+j120Ω can be realized by merely changing the element value (capacitance) of the capacitor CL1A. Accordingly, even if the element is small in size, a wide range of complex impedances can be realized by the above-mentioned phase components. In other words, the unbalanced-balanced conversion circuit element 10A capable of realizing a wide range of complex impedances by including phase components can be made to have a small size.

Figure 13:
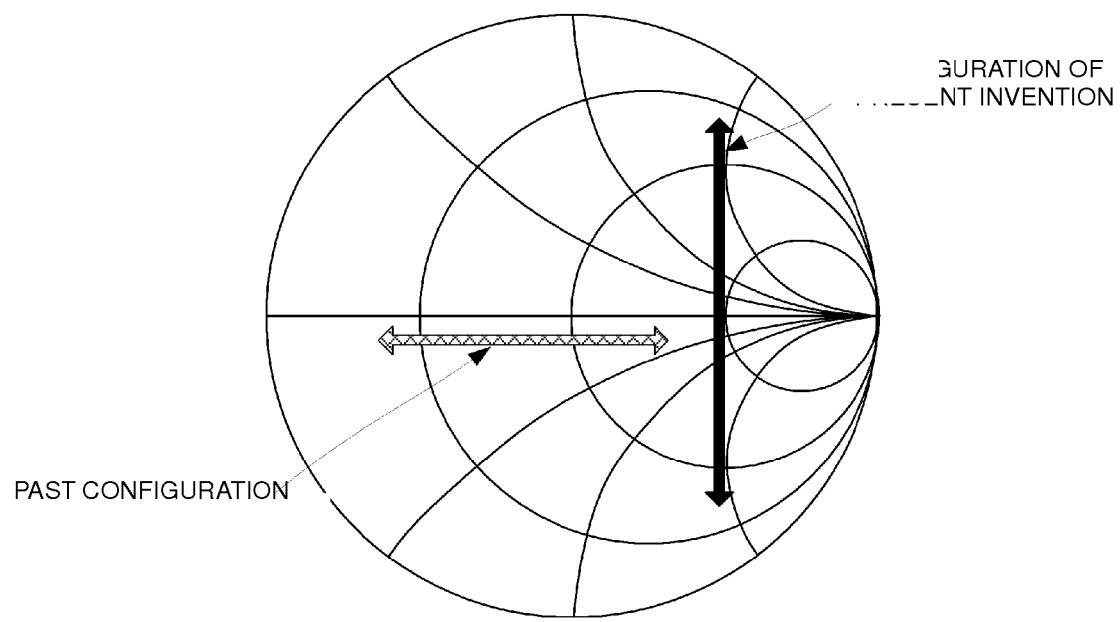
FIG. 13 is a conceptual diagram illustrating a range of impedance values that is obtainable with the unbalanced-balanced conversion circuit elements of the first and second preferred embodiments of the present invention.

As described in the first and second preferred embodiments, by connecting an inductor or a capacitor between the LPF of the first balanced terminal $P_{B2}$ side and the HPF of the second balanced terminal $P_{B2}$ side, phase adjustment from about −j120Ω to about +j120Ω can be realized with a small circuit element as is. FIG. 13 is a conceptual diagram illustrating a range of impedance that is obtainable with the unbalanced-balanced conversion circuit elements according to the first and second preferred embodiments.

Figure 1:
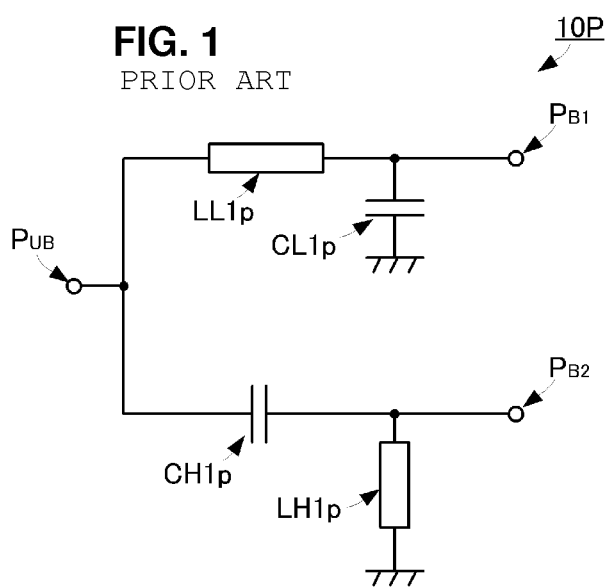
FIG. 1 is a circuit diagram illustrating a general lumped parameter unbalanced-balanced conversion circuit element of the conventional art.
Figure 2:
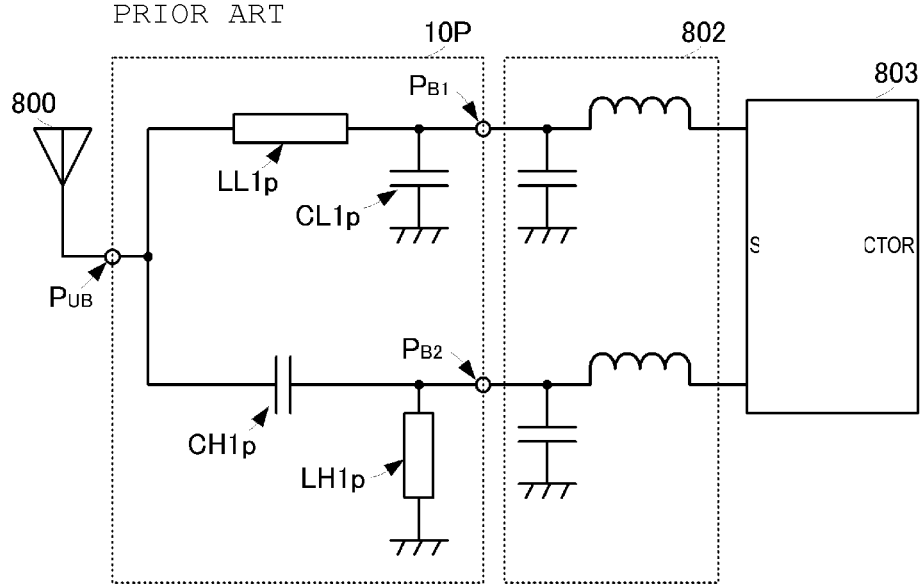
FIG. 2 is a circuit configuration diagram of an RF front-end module of the conventional art.

As shown in FIG. 13, an achievable range of the phase component of complex impedance is extremely narrowed in the configuration of the conventional art as illustrated in FIG. 1; however, by using the configuration according to a preferred embodiment of the present invention, a range achievable in a phase direction can be made much wider than that in the configuration of the conventional art. It is to be noted that the achievable range of the phase component shown in FIG. 13 is just an example, and changes depending on a shape, specifications and so on of the unbalanced-balanced conversion circuit element; however, at least, the phase component can be adjusted within a predetermined range with ease. In this case, the shape of the laminate constituting the unbalanced-balanced conversion circuit element hardly changes, nor becomes larger in size.

Accordingly, phase matching with respect to the phase component of complex impedance of an RF semiconductor IC can be made in a wider range, and in turn a small-sized unbalanced-balanced conversion circuit element can be provided. Further, because a matching circuit between the unbalanced-balanced conversion circuit element and the RF semiconductor IC is not needed, the RF front-end module can be also small in size.

Figure 14:
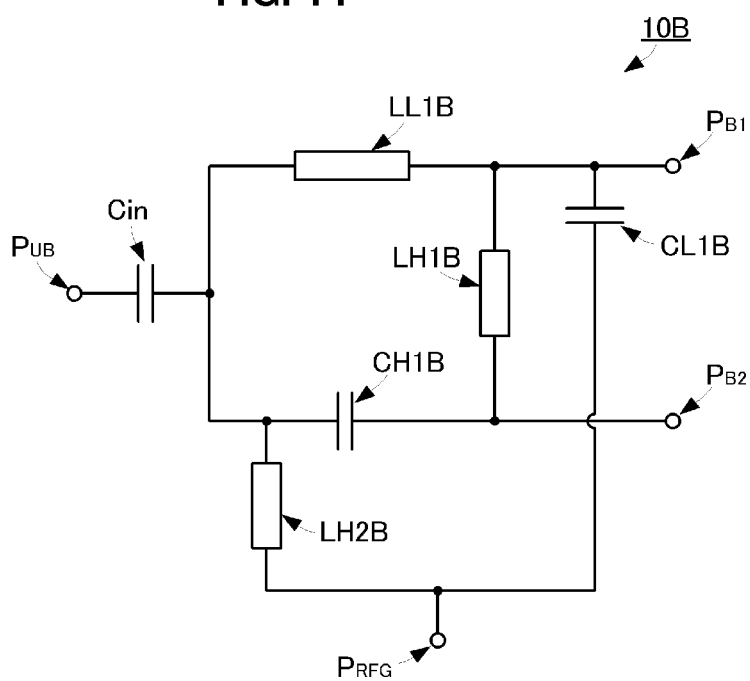
FIG. 14 is a circuit diagram of an unbalanced-balanced conversion circuit element according to a third preferred embodiment of the present invention.

Next, an unbalanced-balanced conversion circuit element according to a third preferred embodiment of the present invention will be described with reference to the drawings. FIG. 14 is a circuit diagram of an unbalanced-balanced conversion circuit element 10B according to the third preferred embodiment. The unbalanced-balanced conversion circuit element 10B of the present preferred embodiment is preferably formed by adding a DC voltage application ground terminal $P_{RFG}$ to the unbalanced-balanced conversion circuit element 10 described in the first preferred embodiment and further adding a plurality of elements along with the addition of the DC voltage application ground terminal $P_{RFG}$. Therefore, the basic unbalanced-balanced conversion function thereof is the same as that of the unbalanced-balanced conversion circuit element 10 described in the first preferred embodiment; accordingly, only the circuit configuration and laminate structure thereof will be specifically described below.

The unbalanced-balanced conversion circuit element 10B includes the unbalanced terminal $P_{UB}$, the balanced terminals including the first balanced terminal $P_{B1}$ and the second balanced terminal $P_{B2}$, and the DC voltage application ground terminal $P_{RFG}$.

An inductor LL1B is connected in series between the unbalanced terminal $P_{UB}$ and the first balanced terminal $P_{B1}$. The inductor LL1B corresponds to the first inductor of an aspect of a preferred embodiment of the present invention. The first balanced terminal $P_{B1}$ side of the inductor LL1B is connected to the DC voltage application ground terminal $P_{RFG}$ via a capacitor CL1B.

A capacitor CH1B is connected in series between the unbalanced terminal $P_{UB}$ and the second balanced terminal $P_{B2}$. The capacitor CH1B corresponds to the first capacitor of an aspect of a preferred embodiment of the present invention. The side of connecting with the inductor LL1B of the capacitor CH1B is connected to the DC voltage application ground terminal $P_{RFG}$ via an inductor LH2B.

An inductor LH1B is connected between the first balanced terminal $P_{B1}$ side of the inductor LL1B and the second balanced terminal $P_{B2}$ side of the capacitor CH1B. The inductor LH1B corresponds to the impedance adjustment element of an aspect of a preferred embodiment of the present invention.

A DC component eliminating capacitor Cin is connected between a connection point of the inductor LL1B and capacitor CH1B and the unbalanced terminal $P_{UB}$.

Figure 15:
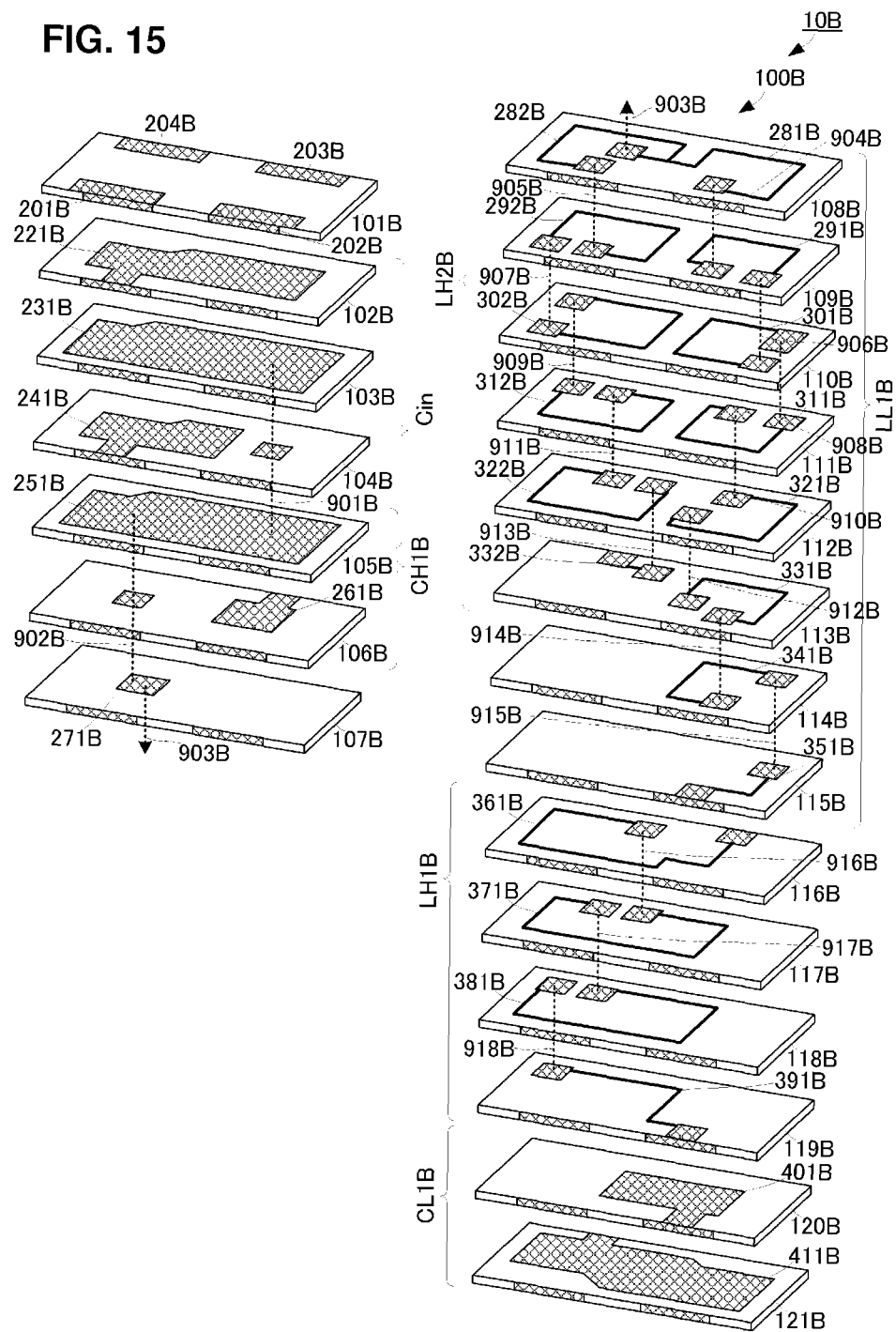
FIG. 15 is an exploded perspective view of the unbalanced-balanced conversion circuit element.

The unbalanced-balanced conversion circuit element 10B having the above-described circuit configuration is constituted by a laminate 100B as shown in FIG. 15. FIG. 15 is an exploded perspective view of the unbalanced-balanced conversion circuit element 10B. Because the outer shape of the unbalanced-balanced conversion circuit element 10B preferably has the same constituent elements as the outer shapes of the unbalanced-balanced conversion circuit elements 10 and 10A described in the first and second preferred embodiments, detailed description thereof is omitted. Note that, in the unbalanced-balanced conversion circuit element 10B of the present preferred embodiment, a first external electrode 201B corresponds to the unbalanced terminal $P_{UB}$, and a second external electrode 202B corresponds to the first balanced terminal $P_{B2}$. Further, in the unbalanced-balanced conversion circuit element 10B of the present preferred embodiment, a third external electrode 203B corresponds to the second balanced electrode $P_{B2}$, and a fourth external electrode 204B corresponds to the DC voltage application ground terminal $P_{RFG}$.

The laminate 100B is, as shown in FIG. 15, preferably formed by laminating 21 dielectric layers on each of which a predetermined electrode pattern is formed. Hereinafter, the configuration of electrode patterns will be described, in which the uppermost layer as the top surface of the laminate 100B is referred to as a 1st layer, and the lowermost layer as the bottom surface of the laminate 100B is referred to as a 21st layer.

The first external electrode 201B, the second external electrode 202B, the third external electrode 203B and the fourth external electrode 204B are located on a dielectric layer 101B of the 1st layer. The first external electrode 201B, the second external electrode 202B, the third external electrode 203B and the fourth external electrode 204B extend from the side surfaces of the dielectric layer 101B up to the top surface.

The first external electrode 201B, the second external electrode 202B, the third external electrode 203B and the fourth external electrode 204B are connected with the side surfaces of dielectric layers 102B through 121B in the laminating direction.

Plate electrodes 221B, 231B, 241B and 251B are located on a dielectric layer 102B of a 2nd layer, a dielectric layer 103B of a 3rd layer, a dielectric layer 104B of a 4th layer and a dielectric layer 105B of a 5th layer, respectively. The plate electrodes 221B and 241B are opposed to the plate electrode 231B and 251B so as to define the DC component eliminating capacitor Cin. The plate electrodes 221B and 241B are respectively extracted and connected to the first external electrode 201B. The plate electrode 231B is connected to the plate electrode 251B through a via electrode 901B. The plate electrode 251B is connected to a line electrode 282B on a dielectric layer 108B through a via electrode 902B, a connection electrode 271B located on a dielectric layer 107B and a via electrode 903B.

A plate electrode 261B defining a portion of the capacitor CH1B is located on a dielectric layer 106B of a 6th layer. The plate electrode 261B is opposed to the plate electrode 251B located on the dielectric layer 105B of the 5th layer so as to configure the capacitor CH1B. The plate electrode 261B is extracted and connected to the third external electrode 203B.

The line electrode 282B, and line electrodes 292B, 302B, 312B, 322B, 332B that define the inductor LH2B are located on the dielectric layer 108B of an 8th layer, a dielectric layer 109B of a 9th layer, a dielectric layer 110B of a 10th layer, a dielectric layer 111B of an 11th layer, a dielectric layer 112B of a 12th layer and a dielectric layer 113B of a 13th layer, respectively. One end of the line electrode 282B is connected to the plate electrode 251B through the via electrode 903B, the connection electrode 271B on the dielectric layer 107B and the via electrode 902B, and also connected to a line electrode 281B which is located on the same layer and is a constituent element of the inductor LL1B. One end of the line electrode 332B is connected to the fourth external electrode 204B.

The other end of the line electrode 282B and the line electrode 292B are connected to each other by a via electrode 905B in the laminating direction. The line electrode 292B and the line electrode 302B are connected to each other by a via electrode 907B in the laminating direction. The line electrode 302B and the line electrode 312B are connected to each other by a via electrode 909B in the laminating direction. The line electrode 312B and the line electrode 322B are connected to each other by a via electrode 911B in the laminating direction. The line electrode 322B and the line electrode 332B are connected to each other by a via electrode 913B in the laminating direction.

The line electrode 281B, and line electrodes 291B, 301B, 311B, 321B, 331B, 341B, 351B that define the inductor LL1B are located on the dielectric layer 108B of the 8th layer, the dielectric layer 109B of the 9th layer, the dielectric layer 110B of the 10th layer, the dielectric layer 111B of the 11th layer, the dielectric layer 112B of the 12th layer, the dielectric layer 113B of the 13th layer, a dielectric layer 114B of a 14th layer and a dielectric layer 115B of a 15th layer, respectively. One end of the line electrode 281B is connected to the line electrode 282B which is located on the same layer and is a constituent element of the inductor LH2B. One end of the line electrode 351B is connected to the second external electrode 202B.

The other end of the line electrode 281B and the line electrode 291B are connected to each other by a via electrode 904B in the laminating direction. The line electrode 291B and the line electrode 301B are connected to each other by a via electrode 906B in the laminating direction. The line electrode 301B and the line electrode 311B are connected to each other by a via electrode 908B in the laminating direction. The line electrode 311B and the line electrode 321B are connected to each other by a via electrode 910B in the laminating direction. The line electrode 321B and the line electrode 331B are connected to each other by a via electrode 912B in the laminating direction. The line electrode 331B and the line electrode 341B are connected to each other by a via electrode 914B in the laminating direction. The line electrode 341B and the line electrode 351B are connected to each other by a via electrode 915B in the laminating direction.

Line electrodes 361B, 371B, 381B and 391B that define the inductor LH1B are located on a dielectric layer 116B of a 16th layer, a dielectric layer 117B of a 17th layer, a dielectric layer 118B of an 18th layer and a dielectric layer 119B of a 19th layer, respectively. One end of the line electrode 361B is connected to the third external electrode 203B. One end of the line electrode 391B is connected to the second external electrode 202B.

The other end of the line electrode 361B and the line electrode 371B are connected to each other by a via electrode 916B in the laminating direction. The line electrode 371B and the line electrode 381B are connected to each other by a via electrode 917B in the laminating direction. The line electrode 381B and the line electrode 391B are connected to each other by a via electrode 918B in the laminating direction.

Plate electrodes 401B and 411B are located on a dielectric layer 120B of a 20th layer and the dielectric layer 121B of the 21st layer, respectively. The plate electrodes 401B and 411B are opposed to each other so as to define the capacitor CL1B. The plate electrode 401B is extracted and connected to the second external electrode 202B. The plate electrode 411B is extracted and connected to the fourth external electrode 204B. The plate electrode 411B defines an inner layer ground electrode in the laminate 100B.

The first external electrode 201B, the second external electrode 202B, the third external electrode 203B and the fourth external electrode 204B are located on the dielectric layer 121B of the 21st layer. The first external electrode 201B, the second external electrode 202B, the third external electrode 203B and the fourth external electrode 204B extend from the side surfaces of the dielectric layer 121B down to the bottom surface.

With the structure as described above, a circuit element that defines the unbalanced-balanced conversion circuit element 10B is provided, in which the capacitors Cin and CH1B, the inductors LL1B, LH2B and LH1B, and the capacitor CL1B are arranged in this order from the top surface side of the laminate 100B. The inner layer ground electrode of the laminate 100B is, as described above, the plate electrode 411B on the dielectric layer 121B as the lowermost layer of the laminate 100B. Accordingly, the dielectric layers defining the inductors LL1B, LH1B, LH2B lie between the plate electrodes 221B, 231B, 241B, 251B, 261B defining the capacitors Cin and CH1B and the plate electrode 401B, the plate electrode 411B defining the inner layer ground electrode. Thus, the plate electrodes 221B, 231B, 241B, 251B and 261B defining the capacitors Cin and CH1B are spaced from the plate electrode 410B and the plate electrodes 411B defining the inner layer ground electrode so as to make it possible to significantly reduce and prevent the generation of parasitic capacitance between the plate electrodes 221B, 231B, 241B, 251B and 261B and the plate electrodes 401B, 411B.

As described thus far, the unbalanced-balanced conversion circuit element 10B having a DC voltage application function can obtain the same action effect as the unbalanced-balanced conversion circuit element 10 described in the first preferred embodiment.

Figure 16:
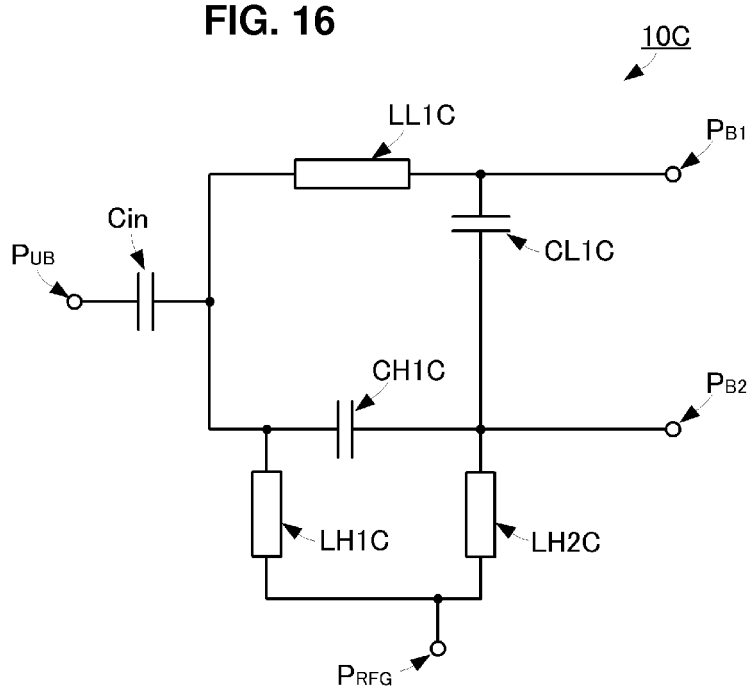
FIG. 16 is a circuit diagram of an unbalanced-balanced conversion circuit element according to a fourth preferred embodiment of the present invention.

Next, an unbalanced-balanced conversion circuit element according to a fourth preferred embodiment of the present invention will be described with reference to the drawings. FIG. 16 is a circuit diagram of an unbalanced-balanced conversion circuit element 10C according to the fourth preferred embodiment. The unbalanced-balanced conversion circuit element 10C of the present preferred embodiment is configured preferably by adding the DC voltage application ground terminal $P_{RFG}$ to the unbalanced-balanced conversion circuit element 10A described in the second preferred embodiment and further adding a plurality of elements along with the addition of the DC voltage application ground terminal $P_{RFG}$. Therefore, the basic unbalanced-balanced conversion function thereof is preferably the same as that of the unbalanced-balanced conversion circuit element 10A described in the second preferred embodiment; accordingly, only the circuit configuration and laminate structure thereof will be specifically described below.

The unbalanced-balanced conversion circuit element 10C includes the unbalanced terminal $P_{UB}$, the balanced terminals including the first balanced terminal $P_{B1}$ and the second balanced terminal $P_{B2}$, and the DC voltage application ground terminal $P_{RFG}$.

An inductor LL1C is connected in series between the unbalanced terminal $P_{UB}$ and the first balanced terminal $P_{B1}$. The inductor LL1C corresponds to the first inductor of an aspect of a preferred embodiment of the present invention. The first balanced terminal $P_{B2}$ side of the inductor LL1C is connected to the DC voltage application ground terminal $P_{RFG}$ via a series circuit configured of a capacitor CL1C and an inductor LH2C.

A capacitor CH1C is connected in series between the unbalanced terminal $P_{UB}$ and the second balanced terminal $P_{B2}$. The capacitor CH1C corresponds to the first capacitor of an aspect of a preferred embodiment of the present invention. The connecting side with the inductor LL1C of the capacitor CH1C is connected to the DC voltage application ground terminal $P_{RFG}$ via an inductor LH1C. The second balanced terminal $P_{B2}$ side of the capacitor CH1C is connected to a connection point of the capacitor CL1C and the inductor LH2C.

Through this, the capacitor CL1C is connected between the first balanced terminal $P_{B2}$ side of the inductor LL1C and the second balanced terminal $P_{B2}$ side of the capacitor CH1C. The capacitor CL1C corresponds to the impedance adjustment element of an aspect of a preferred embodiment of the present invention.

The DC component eliminating capacitor Cin is connected between a connection point of the inductor LL1C and capacitor CH1C and the unbalanced terminal $P_{UB}$.

Figure 17:
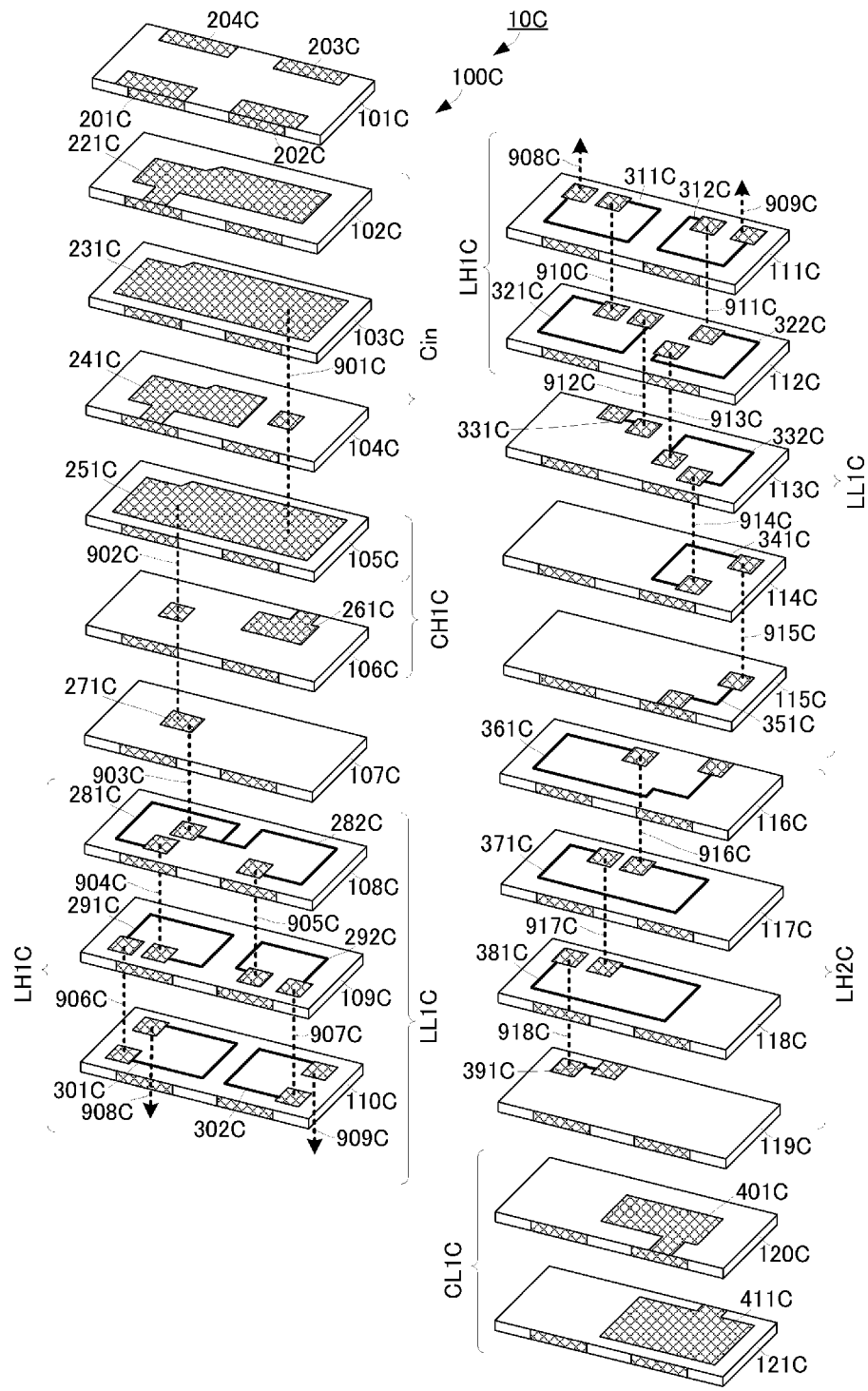
FIG. 17 is an exploded perspective view of the unbalanced-balanced conversion circuit element.

The unbalanced-balanced conversion circuit element 10C having the above-described circuit configuration preferably is constituted by a laminate 100C as shown in FIG. 17. FIG. 17 is an exploded perspective view of the unbalanced-balanced conversion circuit element 10C. Because the outer shape of the unbalanced-balanced conversion circuit element 10C preferably has the same constituent elements as the outer shapes of the unbalanced-balanced conversion circuit elements 10, 10A and 10B described in the first, second and third preferred embodiments, detailed description thereof is omitted. Note that, in the unbalanced-balanced conversion circuit element 10C of the present preferred embodiment, a first external electrode 201C corresponds to the unbalanced terminal $P_{UB}$, and a second external electrode 202C corresponds to the second balanced terminal $P_{B2}$. Further, in the unbalanced-balanced conversion circuit element 10C of the present preferred embodiment, a third external electrode 203C corresponds to the first balanced electrode $P_{B1}$, and a fourth external electrode 204C corresponds to the DC voltage application ground terminal $P_{RFG}$.

The laminate 100C is, as shown in FIG. 17, preferably formed by laminating 21 dielectric layers on each of which a predetermined electrode pattern is provided. Hereinafter, the configuration of electrode patterns will be described, in which the uppermost layer as the top surface of the laminate 100C is referred to as a 1st layer, and the lowermost layer as the bottom surface of the laminate 100C is referred to as a 21st layer.

The first external electrode 201C, the second external electrode 202C, the third external electrode 203C and the fourth external electrode 204C are located on a dielectric layer 101C of the 1st layer. The first external electrode 201C, the second external electrode 202C, the third external electrode 203C and the fourth external electrode 204C extend from the side surfaces of the dielectric layer 101C up to the top surface.

The first external electrode 201C, the second external electrode 202C, the third external electrode 203C and the fourth external electrode 204C are connected with the side surfaces of dielectric layers 102C through 121C in the laminating direction.

Plate electrodes 221C, 231C, 241C and 251C are located on a dielectric layer 102C of a 2nd layer, a dielectric layer 103C of a 3rd layer, a dielectric layer 104C of a 4th layer and a dielectric layer 105C of a 5th layer, respectively. The plate electrodes 221C and 241C are opposed to the plate electrode 231C and 251C so as to define the DC component eliminating capacitor Cin. The plate electrodes 221C and 241C are respectively extracted and connected to the first external electrode 201C. The plate electrode 231C is connected to the plate electrode 251C through a via electrode 901C. The plate electrode 251C is connected to a line electrode 281C on a dielectric layer 108C through a via electrode 902C, a connection electrode 271C located on a dielectric layer 107C and a via electrode 903C.

A plate electrode 261C defining a portion of the capacitor CH1C is located on a dielectric layer 106C of a 6th layer. The plate electrode 261C is opposed to the plate electrode 251C so as to define the capacitor CH1C. The plate electrode 261C is extracted and connected to the third external electrode 203C.

The line electrode 281C, and line electrodes 291C, 301C, 311C, 321C, 331C that define the inductor LH1C are located on the dielectric layer 108C of an 8th layer, a dielectric layer 109C of a 9th layer, a dielectric layer 110C of a 10th layer, a dielectric layer 111C of an 11th layer, a dielectric layer 112C of a 12th layer and a dielectric layer 113C of a 13th layer, respectively. One end of the line electrode 281C is connected to the plate electrode 251C through the via electrode 903C, the connection electrode 271C on the dielectric layer 107C and the via electrode 902C, and also connected to a line electrode 282C which is located on the same layer and is a constituent element of the inductor LL1C. One end of the line electrode 331C is connected to the fourth external electrode 204C.

The other end of the line electrode 281C and the line electrode 291C are connected to each other by a via electrode 904C in the laminating direction. The line electrode 291C and the line electrode 301C are connected to each other by a via electrode 906C in the laminating direction. The line electrode 301C and the line electrode 311C are connected to each other by a via electrode 908C in the laminating direction. The line electrode 311C and the line electrode 321C are connected to each other by a via electrode 910C in the laminating direction. The line electrode 321C and the line electrode 331C are connected to each other by a via electrode 912C in the laminating direction.

The line electrode 282C, and line electrodes 292C, 302C, 312C, 322C, 332C, 341C, 351C that define the inductor LL1C are located on the dielectric layer 108C of the 8th layer, the dielectric layer 109C of the 9th layer, the dielectric layer 110C of the 10th layer, the dielectric layer 111C of the 11th layer, the dielectric layer 112C of the 12th layer, the dielectric layer 113C of the 13th layer, a dielectric layer 114C of a 14th layer and a dielectric layer 115C of a 15th layer, respectively. One end of the line electrode 282C is connected to the line electrode 281C which is located on the same layer and is a constituent element of the inductor LH1C. One end of the line electrode 351C is connected to the second external electrode 202C.

The other end of the line electrode 282C and the line electrode 292C are connected to each other by a via electrode 905C in the laminating direction. The line electrode 292C and the line electrode 302C are connected to each other by a via electrode 907C in the laminating direction. The line electrode 302C and the line electrode 312C are connected to each other by a via electrode 909C in the laminating direction. The line electrode 312C and the line electrode 322C are connected to each other by a via electrode 911C in the laminating direction. The line electrode 322C and the line electrode 332C are connected to each other by a via electrode 913C in the laminating direction. The line electrode 332C and the line electrode 341C are connected to each other by a via electrode 914C in the laminating direction. The line electrode 341C and the line electrode 351C are connected to each other by a via electrode 915C in the laminating direction.

Line electrodes 361C, 371C, 381C and 391C that define the inductor LH2C are located on a dielectric layer 116C of a 16th layer, a dielectric layer 117C of a 17th layer, a dielectric layer 118C of an 18th layer and a dielectric layer 119C of a 19th layer, respectively. One end of the line electrode 361C is connected to the third external electrode 203C. One end of the line electrode 391C is connected to the fourth external electrode 204C.

The line electrode 361C and the line electrode 371C are connected to each other by a via electrode 916C in the laminating direction. The line electrode 371C and the line electrode 381C are connected to each other by a via electrode 917C in the laminating direction. The line electrode 381C and the line electrode 391C are connected to each other by a via electrode 918C in the laminating direction.

Plate electrodes 401C and 411C are located on a dielectric layer 120C of a 20th layer and a dielectric layer 121C of the 21st layer, respectively. The plate electrodes 401C and 411C are opposed to each other so as to define the capacitor CL1C. The plate electrode 401C is extracted and connected to the second external electrode 202C. The plate electrode 411C is extracted and connected to the third external electrode 203C. The plate electrode 401C defines an inner layer ground electrode in the laminate 100C.

The first external electrode 201C, the second external electrode 202C, the third external electrode 203C and the fourth external electrode 204C are located on the dielectric layer 121C of the 21st layer. The first external electrode 201C, the second external electrode 202C, the third external electrode 203C and the fourth external electrode 204C extend from the side surfaces of the dielectric layer 121C down to the bottom surface.

With the structure as described above, a circuit element that defines the unbalanced-balanced conversion circuit element 10C is provided, in which the capacitors Cin and CH1C, the inductors LH1C, LL1C and LH2C, and the capacitor CL1C are arranged in this order from the top surface side of the laminate 100C. The inner layer ground electrode of the laminate 100C is, as described above, the plate electrode 401C on the dielectric layer 120C near the bottom surface of the laminate 100C. Accordingly, the dielectric layers defining the inductors LH1C, LL1C, LH2C lie between the plate electrodes 221C, 231C, 241C, 251C, 261C defining the capacitors Cin and CH1C and the plate electrode 411C, the plate electrode 401C defining the inner layer ground electrode. Thus, the plate electrodes 221C, 231C, 241C, 251C and 261C defining the capacitors Cin and CH1C are spaced from the plate electrode 411C and the plate electrodes 401C defining the inner layer ground electrode so as to make it possible to significantly reduce and prevent the generation of parasitic capacitance between the plate electrodes 221C, 231C, 241C, 251C and 261C and the plate electrodes 401C, 411C.

As described thus far, the unbalanced-balanced conversion circuit element 10C having a DC voltage application function can obtain the same action effect as the unbalanced-balanced conversion circuit element 10A described in the second preferred embodiment.

Figure 18:
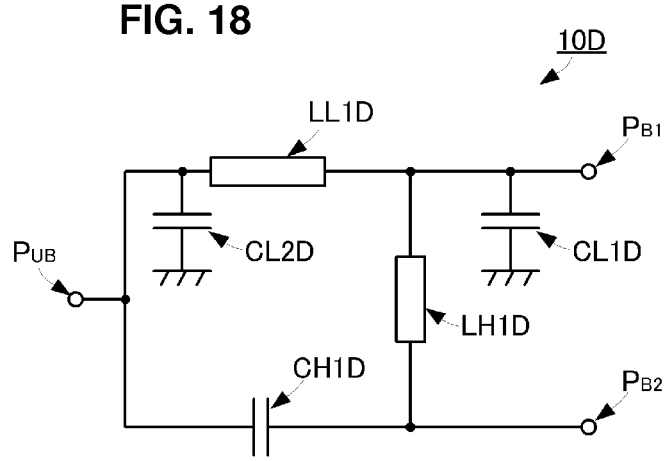
FIG. 18 is a circuit diagram of an unbalanced-balanced conversion circuit element according to a fifth preferred embodiment of the present invention.

Next, an unbalanced-balanced conversion circuit element according to a fifth preferred embodiment of the present invention will be described with reference to the drawings. FIG. 18 is a circuit diagram of an unbalanced-balanced conversion circuit element 10D according to the fifth preferred embodiment. Inductors LL1D, LH1D and capacitors CH1D, CL1D of the unbalanced-balanced conversion circuit element 10D of the present preferred embodiment preferably correspond to the inductors LL1, LH1 and the capacitors CH1, CL1 described in the first preferred embodiment, respectively. In the unbalanced-balanced conversion circuit element 10D, an end portion on the unbalanced terminal $P_{UB}$ side of the inductor LL1D is grounded via a capacitor CL2D. With such a configuration, the same action effect can be obtained as the unbalanced-balanced conversion circuit element 10 described in the first preferred embodiment, and it is possible to shift the center frequencies of LPF and HPF passbands as well as the overall passbands thereof to a lower-frequency side.

Next, an unbalanced-balanced conversion circuit element according to a sixth preferred embodiment of the present invention will be described with reference to the drawings. FIG. 19 is a circuit diagram of an unbalanced-balanced conversion circuit element 10E according to the sixth preferred embodiment. Inductors LL1E, LH1E and capacitors CH1E, CL1E of the unbalanced-balanced conversion circuit element 10E of the present preferred embodiment correspond to the inductors LL1A, LH1A and the capacitors CH1A, CL1A described in the second preferred embodiment, respectively. In the unbalanced-balanced conversion circuit element 10E, an end portion on the unbalanced terminal $P_{UB}$ side of the inductor LL1E is grounded via a capacitor CL2E. With such a configuration, the same action effect can be obtained as the unbalanced-balanced conversion circuit element 10A described in the second preferred embodiment, and it is possible to shift the center frequencies of LPF and HPF passbands as well as the overall passbands thereof to a lower-frequency side.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An unbalanced-balanced conversion circuit element comprising:
   an unbalanced terminal that inputs/outputs an unbalanced signal;
   a pair of balanced terminals including a first balanced terminal and a second balanced terminal that input/output a balanced signal;
   a first inductor connected in series between the unbalanced terminal and the first balanced terminal;

a first capacitor connected in series between the unbalanced terminal and the second balanced terminal;

an impedance adjustment element including an inductor or a capacitor that is connected between the first balanced terminal side of the first inductor and the second balanced terminal side of the first capacitor; and a laminate in which a plurality of dielectric layers are laminated; wherein the first inductor, the first capacitor, and the impedance adjustment element are defined by electrode patterns that are located on the plurality of dielectric layers of the laminate; and the first inductor and the impedance adjustment element are disposed between the first capacitor and a mounting surface of the laminate.

2. The unbalanced-balanced conversion circuit element according to claim 1, further comprising a direct-current component eliminating capacitor that is connected in series between a connection point of the first inductor and the first capacitor and the unbalanced terminal, wherein the direct-current component eliminating capacitor is defined by the electrode patterns located on the plurality of dielectric layers, and the first inductor and the impedance adjustment element are disposed between the DC component eliminating capacitor and the mounting surface of the laminate.

3. The unbalanced-balanced conversion circuit element according to claim 1, further comprising a direct-current voltage application terminal to apply a direct-current voltage, wherein the direct-current voltage application terminal is connected to the first inductor and the first capacitor.

4. The unbalanced-balanced conversion circuit element according to claim 1, further comprising a filter-characteristic adjustment element that connects the first balanced terminal or the second balanced terminal to ground, wherein if the impedance adjustment element is defined by an inductor, the filter-characteristic adjustment element is defined by a capacitor that connects the first balanced terminal to ground; and if the impedance adjustment element is defined by a capacitor, the filter-characteristic adjustment element is defined by an inductor that connects the second balanced terminal to the ground.

5. The unbalanced-balanced conversion circuit element according to claim 1, further comprising a second capacitor that connects an end portion of the first inductor, on a side of a connection point between the first inductor and the first capacitor, to ground.

* * * * *